Figure 1:
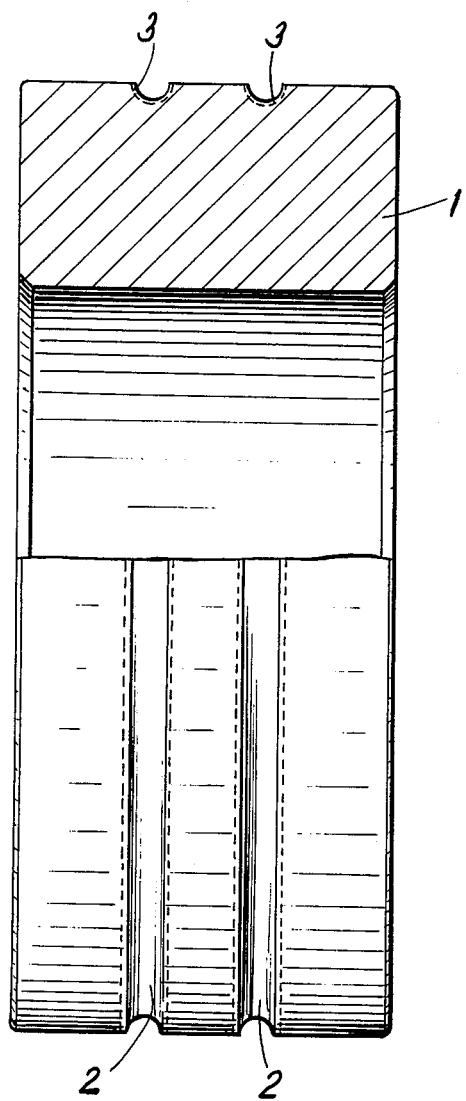

United States Patent [19]

Strohmeier et al.

[11] 3,974,555
[45] Aug. 17, 1976

[54] ROLLS FOR ROLLING MILLS AND METHOD FOR MAKING SAME

[75] Inventors: Gerolf Strohmeier; Johann Bodem, both of Reutte, Austria

[73] Assignee: Schwarzkopf Development Corporation, New York, N.Y.

[22] Filed: May 16, 1975

[21] Appl. No.: 578,197

[52] U.S. Cl. .................................. 29/132; 427/402
[51] Int. Cl.² ....................................... B21B 31/08
[58] Field of Search ............. 29/132; 427/404, 405, 427/402

[56] References Cited
UNITED STATES PATENTS

| | | |
|---|---|---|
| 3,609,849 | 10/1971 | Krol ....................................... 29/132 |
| 3,772,749 | 11/1973 | Loguist ................................. 29/132 |
| 3,842,471 | 10/1974 | Polhall .................................. 29/132 |
| 3,847,763 | 11/1974 | Svensson .............................. 29/132 |

*Primary Examiner*—Reinaldo P. Machado
*Attorney, Agent, or Firm*—Morgan, Finnegan, Pine Foley & Lee

[57] ABSTRACT

Disclosed are improved rolls for use in elevated temperature rolling operations and a method for making said rolls. At least a portion of said rolls comprises a coated surface, said coating comprising carbides, carbonitrides, nitrides, borides or oxides of at least one member of the group consisting of the Group III to Group VI elements of the Periodic Table.

26 Claims, 1 Drawing Figure

U.S. Patent    Aug. 17, 1976    3,974,555

ROLLS FOR ROLLING MILLS AND METHOD FOR MAKING SAME

The peripheral speed of rolls has been steadily increased in order to make the operation of rolling mills more economical. To counter increased wear attributable to higher rolling speeds, rolls have more recently been made of materials with greater wear resistance, for example, cemented carbide. Rolls made wholly of cemented carbide or at least faced with cemented carbide have given particularly good service at elevated rolling temperatures, for example, above 700°C.

The commercial grades of such cemented carbides consist of hard carbides bonded by means of a softer binder metal, usually cobalt, and at high rolling temperatures, there is a risk of the comparatively soft binder metal welding to the material being rolled. Furthermore, the cemented carbide is subjected to various corrosive influences, such as additives and impurities.

The present invention avoids the disadvantages normally present with cemented carbide faced or solid cemented carbide rolls. The invention, which is particularly useful in hot rolling at temperatures above 700°C, comprises rolls which are coated, particularly in the areas subjected to wear, with a hard material. This hard material, preferably applied in more than one layer, consists preferably of carbides, nitrides, borides or oxides of the group III to VI elements of the Periodic Systems, and exhibits a microhardness of at least 1500 kg/mm$^2$. Coatings having a total thickness of from about 5 to about 15 $\mu$ have proved most suitable, although coatings with thicknesses ranging from about 1 to about 50 $\mu$ may also be used. Compounds of titanium with carbon and nitrogen, for example titanium carbide, titanium carbonitride and titanium nitride, have given good service.

A preferred embodiment of the invention includes forming a carbon-rich layer on a roll having a surface of cemented carbide; then forming a continuous transition coating from carbon-rich to carbonitride-rich; and finally, if so desired, forming a pure nitride layer. Coatings having this structure adhere very well to the original cemented carbide surface of the roll. They exhibit great wear resistance and show no trend to welding on with the material being rolled, even at high rolling temperatures. Such coated rolls are also highly resistant to corrosive attack. The coating is preferably deposited from the gas phase, because the composition of the different layers can be readily controlled with this process.

The invention is illustrated by means of the following example:

The FIGURE shows a roll for wire rolling which is operated with a peripheral speed of 50 m/sec at 750°C. The base body 1 of the roll consists of cemented carbide containing 90% tungsten carbide and 10% cobalt. The two calibers 2 of the roll are faced with titanium carbonitride. The coating was produced in the following manner:

The cemented carbide base body 1 is first cleaned and then carburized in order to enrich the surface with carbon. The parts of the base body which are not to be coated may be masked during the carburizing process. The cemented carbide body is then annealed at 850° to 1200°C in a gas mixture consisting of hydrogen, titanium tetrachloride, methane and some nitrogen. The gas mixture reacts at the surface of the cemented carbide and a titanium carbonitride with high carbon content is deposited. After 5 to 20 minutes, the methane supply is gradually reduced, and that of nitrogen increased. The parts are then coated for another 20 to 60 minutes with a gas mixture consisting of titanium tetrachloride, hydrogen and nitrogen, with pure titanium nitride being deposited.

Metallographic examination of such coatings shows that, depending on the conditions (temperature, time and gas composition), the coatings consist of a 0.5 to 3 $\mu$ thick layer of carbon-rich titanium carbonitride, with a gradual transition to a 3 to 20 $\mu$ thick nitrogen-rich titanium nitride layer. Since titanium carbide and titanium nitride are miscible in all proportions, sharp phase boundaries are not present in the coating. The invention may be applied to all types of rolls. Simultaneously with the hard materials, additions of soft binder metal, for example up to 20% of at least one member of the group consisting of iron, cobalt and nickel may be applied; and other processes for applying the coating may be used, such as sputtering.

I claim:

1. An improved roll for hot rolling at elevated temperatures, said roll comprising a hard coating, said coating comprising at least one member of the group consisting of carbides, carbonitrides, nitrides, borides and oxides of Group III to Group VI elements of the Periodic Table.

2. A roll according to claim 1, wherein said coating is from about 1 to about 50 $\mu$ in thickness.

3. A roll according to claim 2, wherein said coating comprises a carbon-rich layer at the surface of said roll and a nitride-rich layer at the surface of said coating.

4. A roll according to claim 3, wherein said coating comprises a continuous transition in composition from said carbon-rich layer to said nitride-rich layer.

5. A roll according to claim 4, wherein said coating comprises from 0 to about 20 weight percent of at least one soft binder metal.

6. A roll according to claim 5, wherein said soft binder metal is selected from the group consisting of iron, cobalt and nickel.

7. A roll according to claim 4, wherein the surface of said coating consists essentially of at least one nitride.

8. A roll according to claim 7, wherein said coating is from about 5 to about 15 $\mu$ in thickness.

9. An improved roll for hot rolling at elevated temperatures, said roll comprising a hard coating, said coating comprising carbides, carbonitrides and nitrides of titanium.

10. A roll according to claim 9, wherein said roll, prior to coating, comprises a cemented carbide surface.

11. A roll according to claim 9, wherein said coating comprises a carbon-rich layer at the surface of said roll and a titanium nitride-rich layer at the surface of said coating.

12. A roll according to claim 11, wherein said coating comprises a continuous transition in composition from said carbon-rich layer to said titanium nitride-rich layer, said continuous transition comprising titanium carbonitride.

13. A roll according to claim 12, wherein the surface of said coating consists essentially of titanium nitride.

14. A roll according to claim 12, wherein said coating comprises from 0 to about 20 weight percent of at least one soft binder metal.

15. A roll according to claim 14, wherein said soft binder metal is selected from the group consisting of iron, cobalt and nickel.

16. A roll according to claim 12, wherein said coating is from about 1 to about 50 μ in thickness.

17. A roll according to claim 16, wherein said coating is from about 5 to about 15 μ in thickness.

18. An improved roll for hot rolling at elevated temperatures, said roll comprising a cemented carbide surface having a coating thereon, said coating comprising:
 a. a carbon-rich layer at the surface of said roll;
 b. a titanium nitride-rich layer at the surface of said coating; and
 c. a continuous transition in composition from said roll surface layer to said coating surface layer, said continuous transition comprising titanium carbonitride.

19. A roll according to claim 18, wherein said coating comprises from 0 to about 20 weight percent of a soft binder metal.

20. A roll according to claim 19, wherein said soft binder metal is selected from the group consisting of iron, cobalt and nickel.

21. A roll according to claim 18, wherein said coating is from about 1 to about 50 μ in thickness.

22. A roll according to claim 21, wherein said coating is from about 5 to about 15 μ in thickness.

23. A method for making improved rolls comprising a coating, said method comprising the steps:
 a. forming a carbon-rich layer on the surface of a roll; and
 b. forming a continuous transition layer from said carbon-rich layer to the coating surface, said transition layer comprising a carbide-rich inner layer and a nitride-rich outer layer, said transition layer comprising carbides, carbonitrides and nitrides of at least one member of the group consisting of the Group III to Group VI elements of the Periodic Table.

24. A method according to claim 23, wherein the surface of said coating consists essentially of said nitride.

25. A method for making improved rolls comprising a coating, said method comprising the steps:
 a. forming a carbon-rich layer on the surface of a cemented carbide roll; and
 b. forming a continuous transition layer from said carbon-rich layer to the coating surface, said transition layer comprising a titanium carbide-rich inner layer and a titanium nitride-rich outer layer, said transition layer comprising carbides, carbonitrides and nitrides of titanium.

26. A method according to claim 25, wherein the surface of said coating consists essentially of titanium nitride.

* * * * *